US008115216B2

(12) United States Patent
Smith et al.

(10) Patent No.: US 8,115,216 B2
(45) Date of Patent: Feb. 14, 2012

(54) OPTOELECTRONIC DISPLAY AND METHOD OF MANUFACTURING THE SAME

(75) Inventors: Euan Smith, Longstanton (GB); Mark Bale, Wells (GB)

(73) Assignee: Cambridge Display Technology Limited, Cambridgeshire (GB)

(*) Notice: Subject to any disclaimer, the term of this patent is extended or adjusted under 35 U.S.C. 154(b) by 380 days.

(21) Appl. No.: 12/296,924

(22) PCT Filed: Apr. 5, 2007

(86) PCT No.: PCT/GB2007/001268
§ 371 (c)(1),
(2), (4) Date: Jul. 16, 2009

(87) PCT Pub. No.: WO2007/128971
PCT Pub. Date: Nov. 15, 2007

(65) Prior Publication Data
US 2009/0302331 A1  Dec. 10, 2009

(30) Foreign Application Priority Data
Apr. 12, 2006  (GB) ................................. 0607369.6

(51) Int. Cl.
*H01L 33/36*  (2010.01)
(52) U.S. Cl. ............ 257/88; 257/89; 313/504; 313/505; 438/34

(58) Field of Classification Search .................. 257/89, 257/E27.121, 88, 91, E33.065; 345/695; 349/144, 146; 313/503, 504, 505; 438/34
See application file for complete search history.

(56) References Cited

U.S. PATENT DOCUMENTS

| 2002/0047567 A1 | 4/2002 | Fujita et al. |
| 2003/0160915 A1 | 8/2003 | Liu |
| 2005/0127819 A1* | 6/2005 | Ohtani ..................... 313/500 |
| 2006/0033422 A1* | 2/2006 | Chao et al. .................. 313/500 |

FOREIGN PATENT DOCUMENTS

| EP | 1 544 928 A2 | 6/2005 |
| JP | 2000-260573 A | 9/2000 |

* cited by examiner

*Primary Examiner* — Victor A Mandala
*Assistant Examiner* — Scott Stowe
(74) *Attorney, Agent, or Firm* — McDermott Will & Emery LLP

(57) ABSTRACT

An optoelectronic display comprising a plurality of pixels, each pixel comprising a plurality of sub-pixels, wherein the optoelectronic display comprises a colour-forming layer which is patterned providing a plurality of discrete colour-forming regions in a two-dimensional array, and wherein an addressing array is provided for addressing the discrete colour-forming regions, at least some of the discrete colour-forming regions having portions which are separately addressable by the addressing array, each portion defining a sub-pixel of the optoelectronic display.

22 Claims, 9 Drawing Sheets

LIGHT EMISSION

OPTOELECTRONIC DISPLAY AND METHOD OF MANUFACTURING THE SAME

FIELD OF INVENTION

This invention relates to an optoelectronic display and a method of manufacturing the same.

BACKGROUND OF INVENTION

Various types of optoelectronic displays are known in the art. These include, for example, Liquid Crystal Displays (LCDs), ElectroLuminescent (EL) displays, and Plasma Displays (PDs).

Multicoloured displays typically comprise a plurality of pixels, each pixel comprising a plurality of sub-pixels. In a full colour display, red, green, and blue sub-pixels are provided. The sub-pixels are defined by a colour-forming layer. The colour-forming layer may be a light-emissive layer comprising a plurality of discrete light-emissive regions of different light-emissive material defining the sub-pixels. For example, an EL display has such a light-emissive layer disposed between electrodes which are patterned so as to be able to address the individual sub-pixels which correspond to the discrete light-emissive regions of the light-emissive layer.

Alternatively, the colour-forming layer may be a colour filter comprising a plurality of discrete regions of different colour defining the sub-pixels. For example, an LCD may have such a filter with a white backlight and a liquid crystal arrangement for addressing the individual sub-pixels that correspond to the discrete coloured regions of the filter.

Various different arrangements for the pixels and the sub-pixels of a light-emissive display have been proposed in the prior art. FIG. 1 shows a standard pixel arrangement in which each pixel 2 comprises a single red sub-pixel 4, a single green sub-pixel 6 and a single blue sub-pixel 8, all of which are the same size.

Improvements over the basic arrangement shown in FIG. 1 have been suggested, such as the arrangements disclosed in US 2003/0117423, WO 03/060870 and 2004/0080479. These "checkerboard" arrangements are adapted to provide better visual performance when compared to the standard arrangement shown in FIG. 1. An example is shown in FIG. 2 of the present application, each pixel 2 comprising a central blue sub-pixel 8, with red sub-pixels 4 in one pair of diagonally opposing corners, and green sub-pixels 6 in the other pair of diagonally opposing corners. The sub-pixels are arranged so that around a junction between four adjacent pixels, the sub-pixels alternate between red and green.

A problem with the aforementioned arrangements is that it is difficult to provide an intricately patterned colour-forming layer. Furthermore, depending on the materials and the patterning techniques used, there will be a lower limit to the size of discrete colour-forming regions that can be reliably formed.

Embodiments of the present invention seek to solve the aforementioned problems in the prior art by providing a pixel/sub-pixel arrangement that is easier to manufacture and has good visual performance.

SUMMARY OF THE PRESENT INVENTION

According to a first aspect of the present invention there is provided an optoelectronic display comprising a plurality of pixels, each pixel comprising a plurality of sub-pixels, wherein the optoelectronic display comprises a colour-forming layer which is patterned providing a plurality of discrete colour-forming regions in a two-dimensional array, and wherein an addressing array is provided for addressing the discrete colour-forming regions, at least some of the discrete colour-forming regions having portions which are separately addressable by the addressing array, each portion defining a sub-pixel of the optoelectronic display.

By two-dimensional array, we mean an array comprising a plurality of point-like discrete colour-forming regions. The point-like colour-forming regions may have various shapes including circular, oval, rectangular, square and hexagonal.

By "discrete colour forming region" we mean a continuous region of colour-forming material rather than a plurality of colour-forming regions. By continuous region, we mean continuous in the plane of the display. A discrete colour-forming region may comprise a number of layers, one on top of the other, in a direction perpendicular to the plane of the display. However, if such layers are continuous in the plane of the display then they would constitute a discrete colour-forming region.

The present invention solves the problems previously outlined with regard to the prior art "checkerboard" arrangements in that each sub-pixel does not have to be defined by a corresponding discrete colour-forming region. At least some of the discrete colour-forming regions provide a plurality of sub-pixels which are individually addressable by the addressing array. This simplifies the patterning process for the colour-forming layer while not significantly reducing visual performance of the display. Furthermore, an increase in resolution can be achieved with no change in the pattern of the colour-forming layer.

Preferably, each separately addressable portion defines a sub-pixel of a different pixel in the optoelectronic display. The discrete colour-forming regions may have any number of separately addressable portions. However, in preferred arrangements discrete colour forming regions have 2, 3, 4 or 6 separately addressable portions.

According to some embodiments of the present invention, the colour-forming layer is emissive. Alternatively, the colour-forming layer is a colour filter layer, a phosphor layer or a colour changing media such as a fluorescent dye. An example is an optoelectronic display which comprises: a substrate; a first electrode layer disposed over the substrate; a light-emissive layer disposed over the first electrode layer; and a second electrode layer disposed over the light-emissive layer. The light emissive layer constitutes the colour-forming layer which is patterned providing a plurality of discrete light-emissive regions in a two-dimensional array. The electrode layers constitute the addressing array with the first electrode layer and/or the second electrode layer comprising a plurality of electrodes, each electrode comprising at least two sub-electrodes drivably associated with each discrete light-emissive region.

The provision of at least two sub-electrodes associated with each discrete light-emissive region allows areas of the discrete light-emissive region to be differentially driven. Accordingly, a discrete light-emissive region can contribute to a plurality of different sub-pixels.

In a preferred embodiment the light-emissive layer is patterned by providing a bank structure disposed over the first electrode layer defining a plurality of wells, each well containing one of the discrete light-emissive regions, whereby at least two of the sub-electrodes are associated with each well.

Preferably, the first electrode layer comprises said plurality of electrodes with at least two of the sub-electrodes being associated with each discrete light-emissive region. Preferably, the first electrode is the anode. The anode may be any suitable material but is preferably ITO.

One class of optoelectronic displays is that using an organic material for light emission. The basic structure of these devices is a light emissive organic layer, for instance a film of a poly (p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating photons. In WO90/13148 the organic light-emissive material is a polymer. In U.S. Pat. No. 4,539,507 the organic light-emissive material is of the class known as small molecule materials, such as (8-hydroxyquinoline) aluminium ("Alq3"). In a practical device one of the electrodes is transparent, to allow the photons to escape the device.

A typical organic light-emissive display (OLED) is fabricated on a glass or plastic substrate coated with a transparent anode such as indium-tin-oxide ("ITO"). A layer of a thin film of at least one electroluminescent organic material covers the first electrode. Finally, a cathode covers the layer of electroluminescent organic material. The cathode is typically a metal or alloy and may comprise a single layer, such as aluminium, or a plurality of layers such as calcium and aluminium.

In operation, holes are injected into the device through the anode and electrons are injected into the device through the cathode. The holes and electrons combine in the organic electroluminescent layer to form excitons which then undergo radiative decay to give light (in light detecting devices this process essentially runs in reverse).

Organic light-emissive displays can provide a particularly advantageous form of electro-optic display. They are bright, colourful, fast-switching, provide a wide viewing angle and are easy and cheap to fabricate on a variety of substrates. Organic (which here includes organometallic) light-emissive displays may be fabricated using either polymers or small molecules in a range of colours (or in multi-coloured displays), depending upon the materials used.

Organic light-emissive displays may be deposited on a substrate in a matrix of pixels to form a single or multi-colour pixellated display. A multicoloured display may be constructed using groups of red, green, and blue emitting pixels. So-called active matrix displays have a memory element, typically a storage capacitor and a transistor, associated with each pixel whilst passive matrix displays have no such memory element and instead are repetitively scanned to give the impression of a steady image.

Preferably, a conductive polymer layer is disposed between the first electrode layer and the light-emissive layer. This layer may be any suitable material but is preferably PEDOT-PSS.

Preferably, at least one of the conductive polymer layer and the light-emissive layer is deposited by ink jet printing.

If the material of the sub-electrodes is of a low enough conductivity so as to make lateral conduction negligible, then no gap need be provided between the sub-electrodes. For example, sub-electrodes could be made of a thin layer of material in order to increase lateral resistance and reduce lateral conduction thus negating the requirement for a gap between the sub-electrodes. However, in this case, additional conductive connecting lines will usually be required, particularly for a passive matrix display, as otherwise the resistance across the display will generally be too high. This is not such a problem for active matrix displays in which each discrete light-emissive region will have its own driver.

For example, in passive matrix displays an ITO anode of typically 150 nm thickness is used in standard devices. A thinner layer may be used in accordance with embodiments of the present invention in order to avoid lateral conduction between sub-electrodes, e.g. ½ or ¼ of this thickness. In this case, a more conductive connecting line may be provided. In active matrix displays, an ITO anode of this lower thickness can be utilized as the distance between the drivers and the pixels is small.

In embodiments of the present invention, the sub-electrodes are connected to a conductive connecting line via a resistive connection which may be provided by, for example, a thin portion of the electrode material. Providing a resistant connection between the common conductor line and the sub-electrodes gives a "soft" electrical connection so if there is a short the whole line of pixels in the display will not be lost.

Alternatively, a gap may be provided between the sub-electrodes. This gap may be filed with an insulating material in order to planarize the upper surface of the anode. Examples of suitable planarizing, insulating materials include dielectrics such as silicon dioxide or a photoresist. It is advantageous for the planarizing, insulating material to have similar wetting properties to the material of the sub-electrodes for the material deposited thereover. Furthermore, it is advantageous to select a planarizing, insulating material which is not etched away when patterning the bank material. As an alternative to providing a planarizing, insulating material, the gap between sub-electrodes may be made sufficiently small that the material deposited thereover can span the gap. If the electrode layer is thin then there is less or no need to planarize the layer.

It is advantageous for the electrode layer to have a constant thickness in order to prevent non-uniformities in the overlying layers.

In one arrangement, the electrode layer comprising the sub-electrodes comprises two layers, a patterned conductive contact layer defining the sub-electrodes with a uniform layer of charge injecting material thereover. For example, a patterned metal contact layer may be provided with a uniform layer of ITO deposited thereover. The charge injecting material must be of low enough conductance so as to prevent lateral conduction. This may be achieved, for example, by providing a relatively thin layer of ITO as the charge injecting layer.

The electrode layer may be patterned by standard photolithography. However, any patterning techniques can be used including, for example, laser ablation, e-beam ablation, dry etching, and wet etching. Furthermore, the patterning method need not be subtractive and direct writing techniques can be employed such as ink jet printing.

According to another aspect of the present invention there is provided a method of manufacturing a light-emissive display according to the first aspect of the invention, wherein the colour-forming layer is deposited by ink-jet printing.

Ink jet printing is particularly useful due to its scalability and adaptability. The former allows arbitrarily large sized substrates to be patterned and the latter should mean that there are negligible tooling costs associated with changing from one product to another since the image of dots printed on a substrate is defined by software.

However, there are some problems with ink jet printing. There is a limit to how small the individual sub-pixels can be made using ink jet printing. Furthermore, the ink does not wet into tight corners of complex well shapes. These problems can be alleviated by the present invention which allows a high resolution display to be produce without unduly increase the complexity of the sub-pixels or unduly decreasing their size. Primarily, embodiments of the present invention are useful for ink jet printed displays because of the problems involved in achieving flat films for large areas and difficulties in reliably printing very small areas. However, it is envisaged that embodiments of the present invention may also be useful when using other deposition techniques.

If the colour-forming layer is deposited by vacuum deposition of small molecules then a shadow mask is typically used to provide the required resolution. A limit exists in the resolution of the shadow mask and therefore embodiments of the present invention can provide a higher resolution display without unduly increasing the complexity of the sub-pixels or unduly decreasing their size.

BRIEF SUMMARY OF THE DRAWINGS

Embodiments of the present invention will now be described, by way of example only, with reference to the accompanying drawings in which.

DETAILED DESCRIPTION OF PREFERRED EMBODIMENTS

Figure 3:
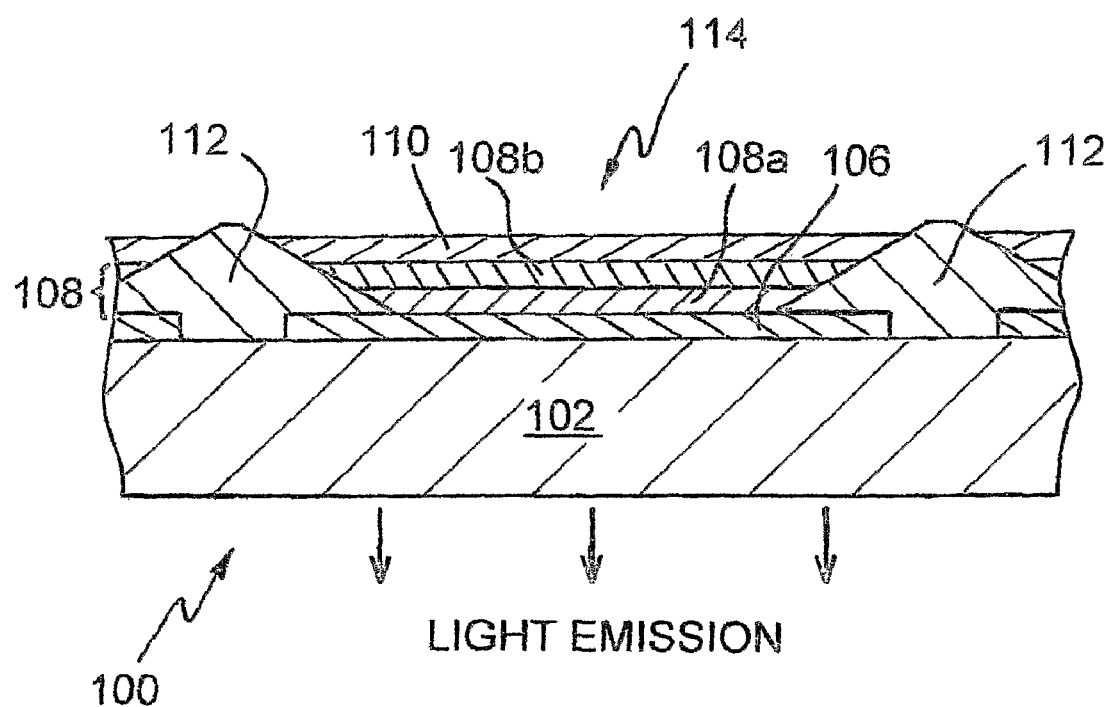
FIG. 3 shows a vertical cross section through an example of an OLED device.

FIG. 3 shows a vertical cross section through an example of an OLED device 100. The structure of the device is somewhat simplified for the purposes of illustration.

Figure 4:
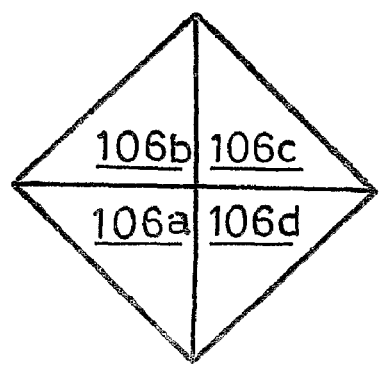
FIG. 4 shows a plan view of an electrode comprising four sub-electrodes in accordance with an embodiment of the present invention.

The OLED 100 comprises a substrate 102, typically 0.7 mm or 1.1 mm glass but optionally clear plastic, on which an anode layer 106 is deposited comprising four separately drivable sub-anodes (shown in FIG. 4). The anode layer typically comprises around 150 nm thickness of ITO (indium tin oxide), over which is provided a metal contact layer, typically around 500 nm of aluminium, sometimes referred to as anode metal. Glass substrates coated with ITO and contact metal may be purchased from Corning, USA. The contact metal (and optionally the ITO) is patterned as desired so that it does not obscure the display, by a conventional process of photolithography followed by etching.

A substantially transparent hole conducting layer 108a is provided over the anode metal, followed by an electroluminescent layer 108b. Banks 112 may be formed on the substrate, for example from positive or negative photoresist material, to define wells 114 into which these active organic layers may be selectively deposited, for example by a droplet deposition or inkjet printing technique. The wells thus define light emitting areas or pixels of the display.

A cathode layer 110 is then applied by, say, physical vapour deposition. The cathode layer typically comprises a low work function metal such as calcium or barium covered with a thicker, capping layer of aluminium and optionally including an additional layer immediately adjacent the electroluminescent layer, such as a layer of lithium fluoride, for improved electron energy level matching. Mutual electrical isolation of cathode lines may achieved through the use of cathode separators. Typically a number of displays are fabricated on a single substrate and at the end of the fabrication process the substrate is scribed, and the displays separated. An encapsulant such as a glass sheet or a metal can is utilized to inhibit oxidation and moisture ingress.

Organic LEDs of this general type may be fabricated using a range of materials including polymers, dendrimers, and so-called small molecules, to emit over a range of wavelengths at varying drive voltages and efficiencies. Examples of polymer-based OLED materials are described in WO90/13148, WO95/06400 and WO99/48160; examples of dendrimer-based materials are described in WO 99/21935 and WO 02/067343; and examples of small molecule OLED materials are described in U.S. Pat. No. 4,539,507. The aforementioned polymers, dendrimers and small molecules emit light by radiative decay of singlet excitons (fluorescence). However, up to 75% of excitons are triplet excitons which normally undergo non-radiative decay. Electroluminescence by radiative decay of triplet excitons (phosphorescence) is disclosed in, for example, "Very high-efficiency green organic light-emitting devices based on electrophosphorescence" M. A. Baldo, S. Lamansky, P. E. Burrows, M. E. Thompson, and S. R. Forrest *Applied Physics Letters*, Vol. 75(1) pp. 4-6, Jul. 5, 1999". In the case of a polymer-based OLED, layers 108 comprise a hole conducting layer 108a and a light emitting polymer (LEP) electroluminescent layer 108b. The electroluminescent layer may comprise, for example, around 70 nm (dry) thickness of PPV poly(p-phenylenevinylene)) and the hole conducting layer, which helps match the hole energy levels of the anode layer and of the electroluminescent layer, may comprise a conductive organic material, for example, around 50-200 nm, preferably around 150 nm (dry) thickness of PEDOT:PSS (polystyrene-sulphonate-doped polyethylene-dioxythiophene).

FIG. 4 shows a plan view of the anode 106 comprising four sub-anodes 106a, 106b, 106c, 106d in accordance with an embodiment of the present invention.

Figure 5:
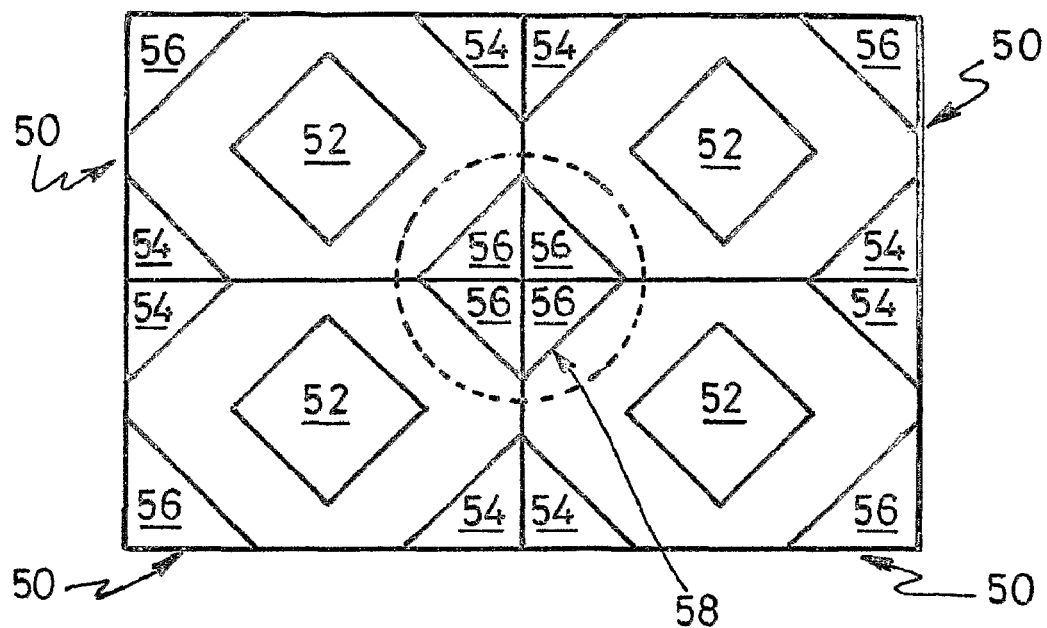
FIG. 5 shows a sub-pixel arrangement according to an embodiment of the present invention.

FIG. 5 shows a sub-pixel arrangement according to an embodiment of the present invention which utilizes electrodes of the type shown in FIG. 4. Each pixel 50, comprises a central blue sub-pixel 52, with red sub-pixels 54 in one pair of diagonally opposing corners, and green sub-pixels 56 in the other pair of diagonally opposing corners as in the prior art arrangement shown in FIG. 2. However, unlike the arrangement in FIG. 2, the sub-pixels at a junction between four adjacent pixels are the same colour and are formed by a single discrete colour-forming region 58. The discrete colour-forming region 58 has four separately addressable portions, each portion contributing a sub-pixel to one of the four pixels shown. The portions are separately addressable by utilizing an electrode of the type shown in FIG. 4 having four sub-electrodes.

Figure 1:
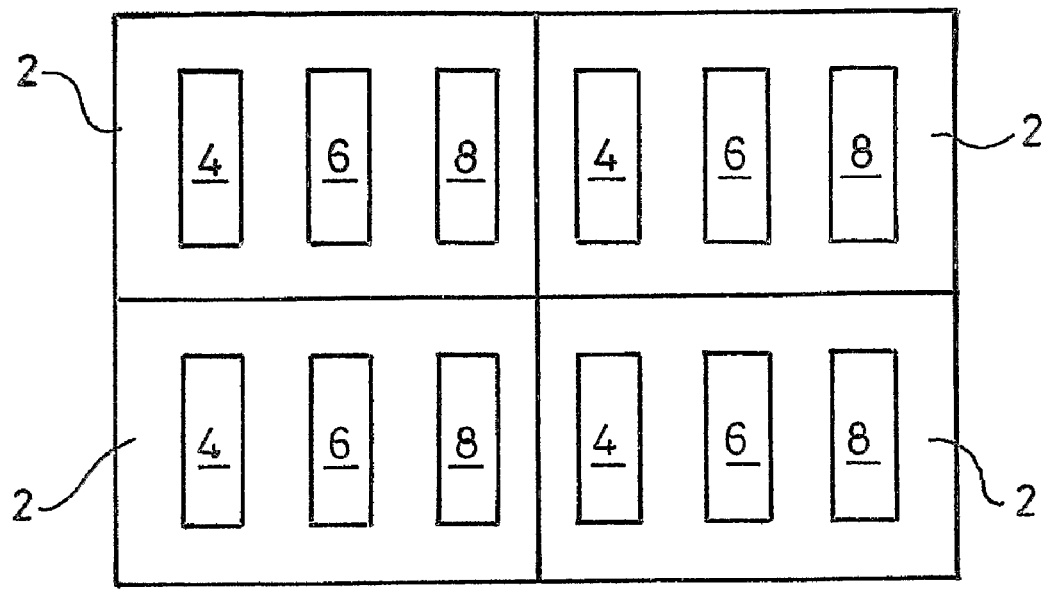
FIG. 1 shows a standard sub-pixel arrangement of a full colour light-emissive display.
Figure 2:
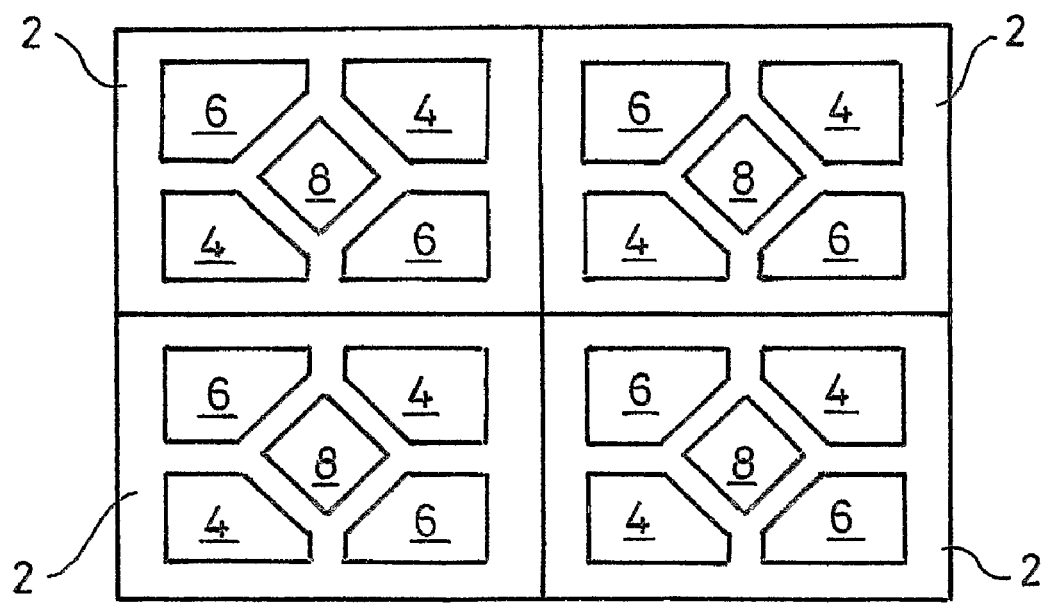
FIG. 2 shows an improved prior art sub-pixel arrangement of a full colour light-emissive display.

Such an arrangement simplifies the prior art arrangement shown in FIG. 2. Less discrete colour-forming regions are required and the discrete colour-forming regions can be made larger and less complex in shape while still providing a display having excellent visual characteristics.

Other arrangements which utilize the present invention are also envisaged. For example, the relative sizes and shape of the discrete colour-forming regions can be varied. For organic light-emissive materials it is often the case that the lifetime of the blue emissive material is the limiting factor on the lifetime of the device. In this case, it is advantageous to provide blue colour-forming regions that have a larger area than the red and green colour-forming regions. By providing the blue colour-forming regions with a larger area, they can be driven at a lower voltage thus increasing the lifetime of the blue colour-forming material in the device. It is to be understood that any of the blue, green and/or red colour-forming regions may have different sizes according to the performance characteristics of the materials and the desired performance characteristics of the display.

Figure 6:
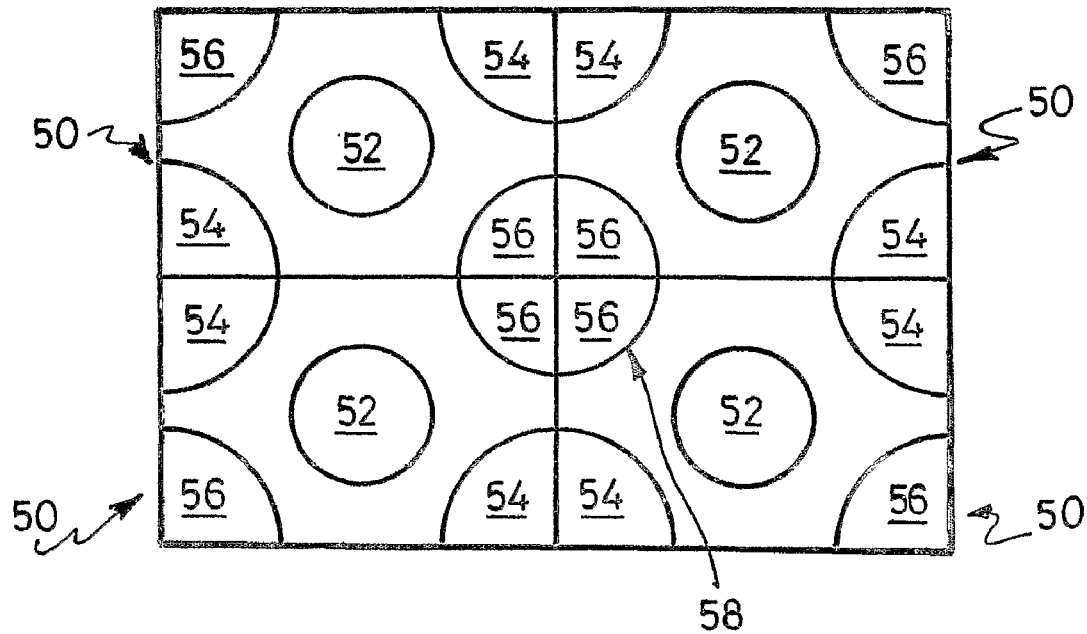
FIG. 6 shows a sub-pixel arrangement according to another embodiment of the present invention.

FIG. 6 shows a similar arrangement to that of FIG. 5 which utilizes round discrete colour-forming regions rather than square. This arrangement may have a lower aperture ratio than that of FIG. 5 but it is advantageous in that the round colour forming regions are more readily ink jet printed. The discrete colour-forming region 58 has four portions which are separately addressable by utilizing an electrode similar to that shown in FIG. 4 but circular in shape having four segments.

Figure 7:
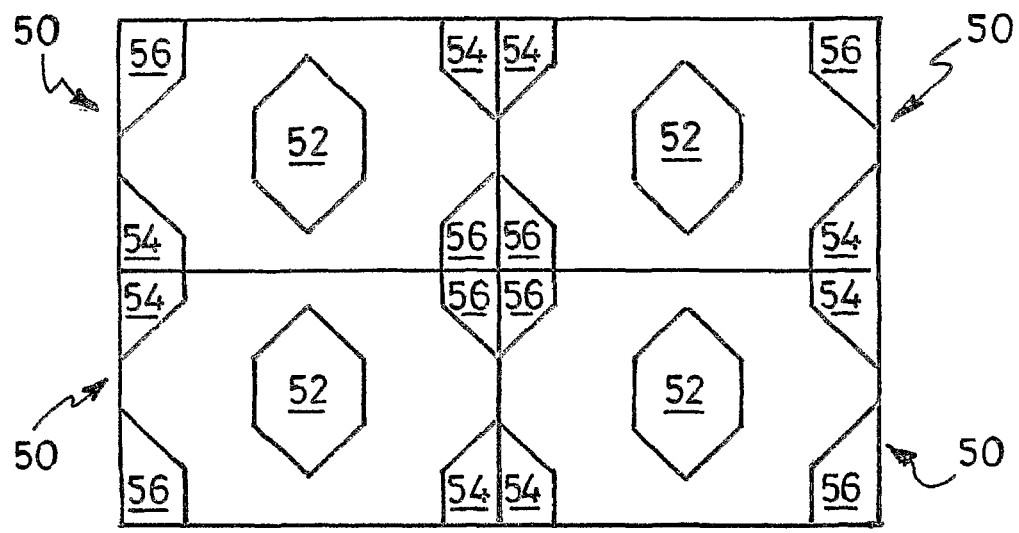
FIG. 7 shows a sub-pixel arrangement according to another embodiment of the present invention.

FIG. 7 shows a similar arrangement to that of FIG. 5 which utilizes hexagonal discrete colour-forming regions rather than square. This arrangement provides a good aperture ratio while having corners that have a greater angle than in the square arrangement such that ink can readily wet the whole of each discrete colour-forming region.

Figure 8:
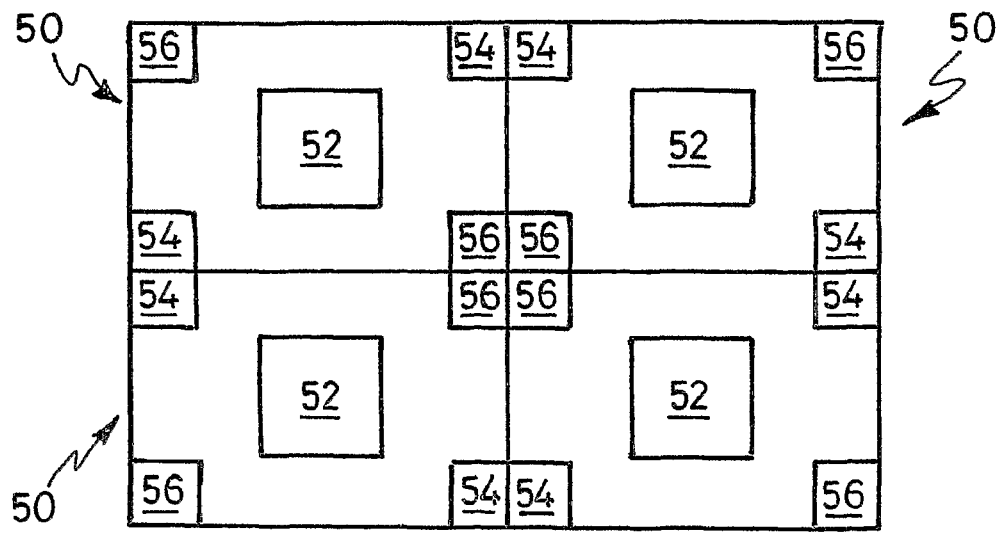
FIG. 8 shows a sub-pixel arrangement according to another embodiment of the present invention.

FIG. 8 shows a similar arrangement to that of FIG. 5 but with the square discrete colour-forming regions in a slightly different orientation.

Figure 9:
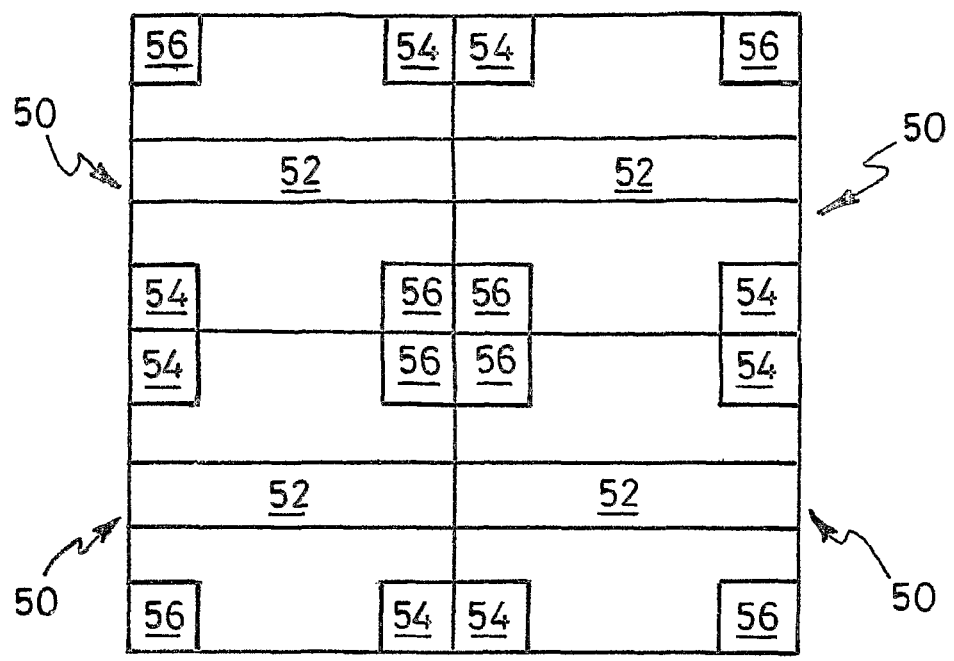
FIG. 9 shows a sub-pixel arrangement according to another embodiment of the present invention.

FIG. 9 shows a similar arrangement to that of FIG. 5 but with the central sub-pixels of adjacent pixels being merged into a continuous strip.

Figure 10:
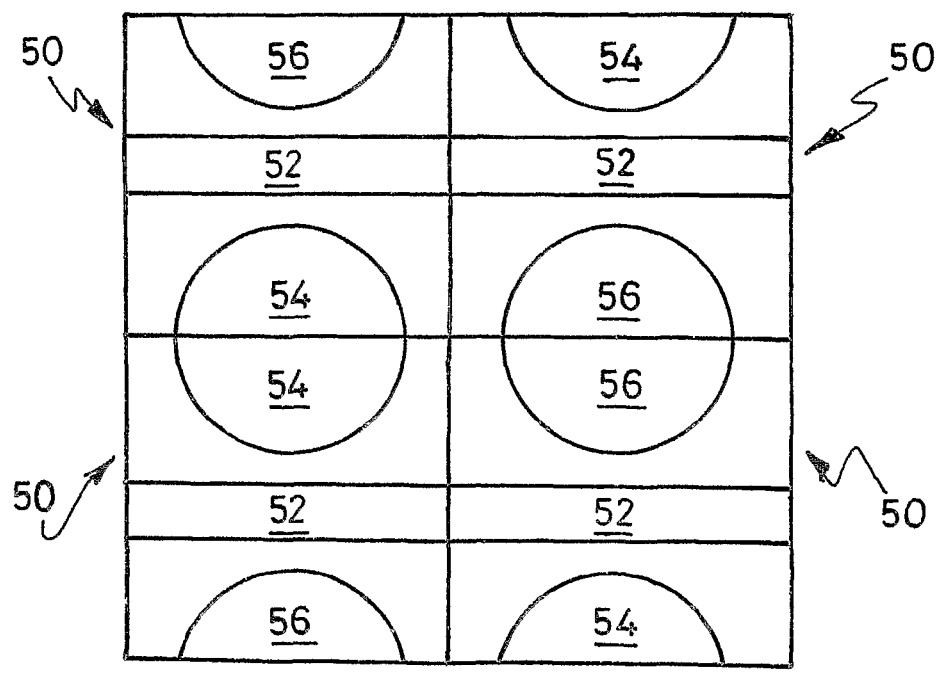
FIG. 10 shows a sub-pixel arrangement according to another embodiment of the present invention.

FIG. 10 shows an arrangement similar to that of FIG. 9 but with circular discrete-colour forming regions disposed between the continuous strips, the circular regions having two portions which are individually addressable by utilizing an electrode similar to that shown in FIG. 4 but circular in shape having two segments.

Figure 11:
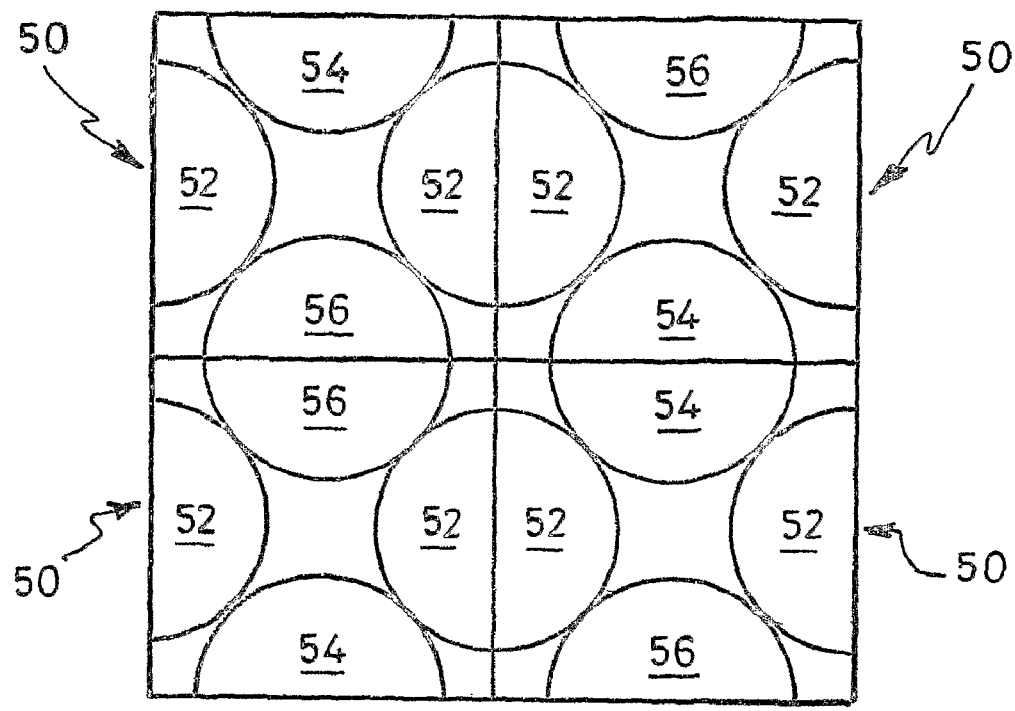
FIG. 11 shows a sub-pixel arrangement according to another embodiment of the present invention.

FIG. 11 shows an arrangement in which all the discrete colour-forming regions comprise two portions that are individually addressable.

Figure 12:
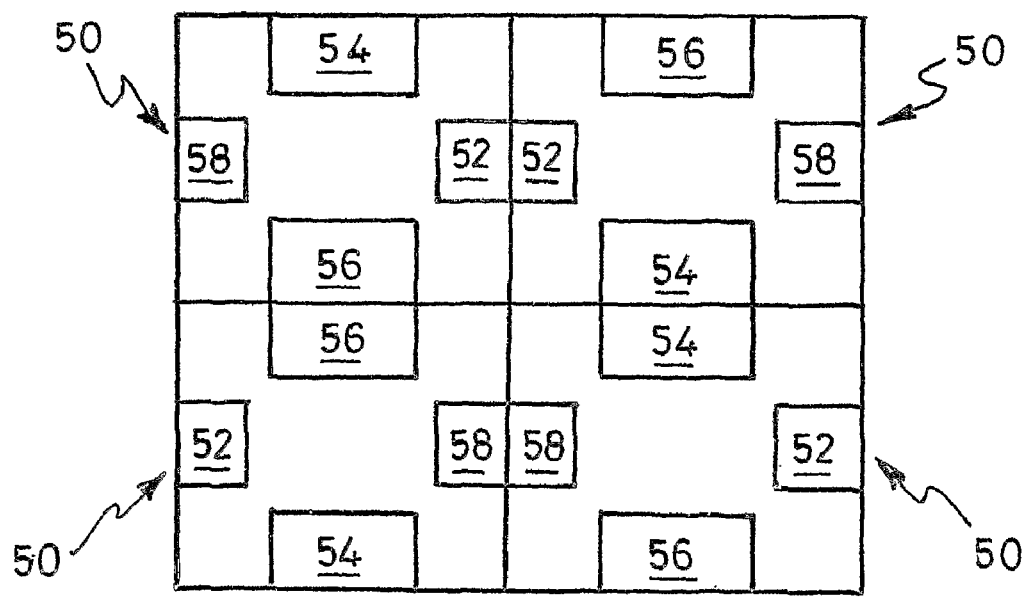
FIG. 12 shows a sub-pixel arrangement according to another embodiment of the present invention.

FIG. 12 shows an arrangement which further comprises white colour-forming regions 58.

Figure 13:
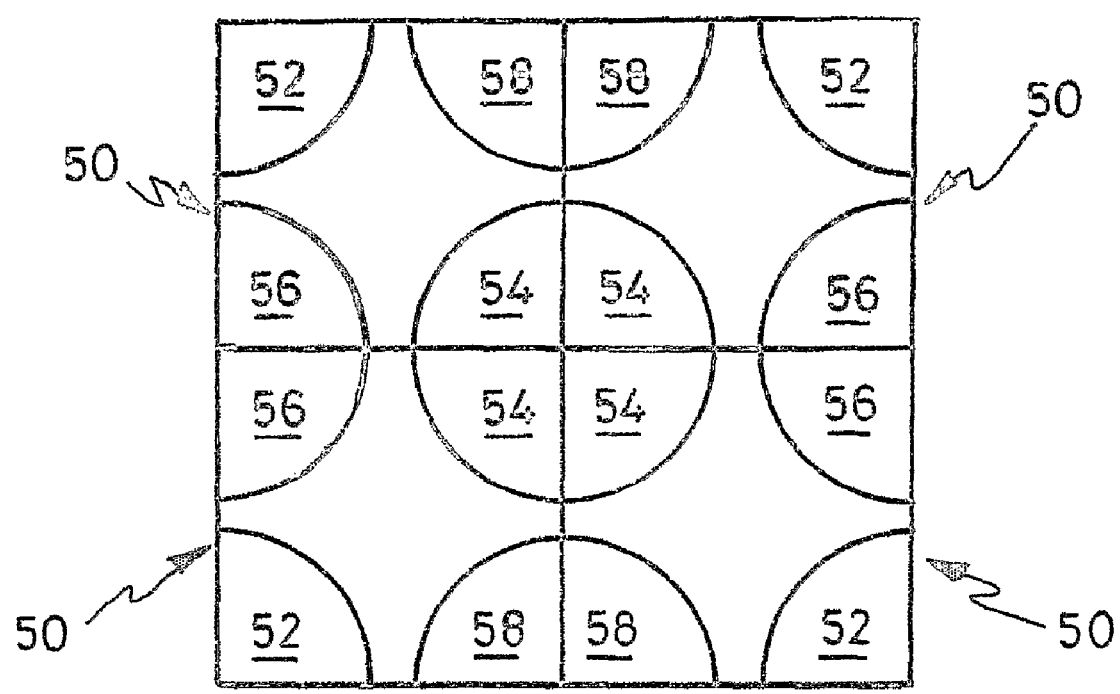
FIG. 13 shows a sub-pixel arrangement according to another embodiment of the present invention.

FIG. 13 shows a similar arrangement to that illustrated in FIG. 11 but further including white colour-forming regions 58.

Figure 14:
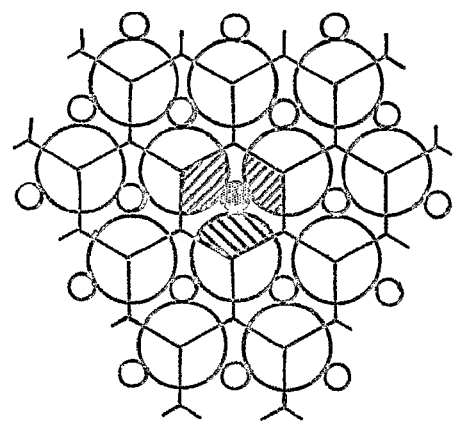
FIG. 14 shows an arrangement in which the pixels are hexagonal.
Figure 15:
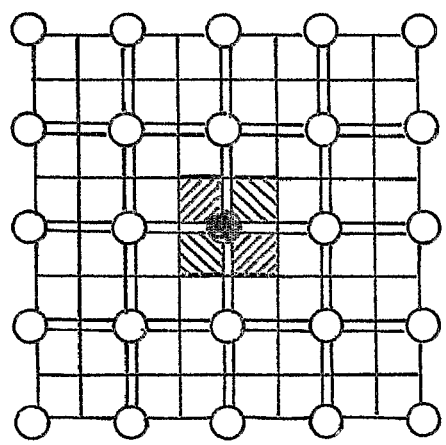
FIG. 15 shows an arrangement in which the pixels are square.
Figure 16:
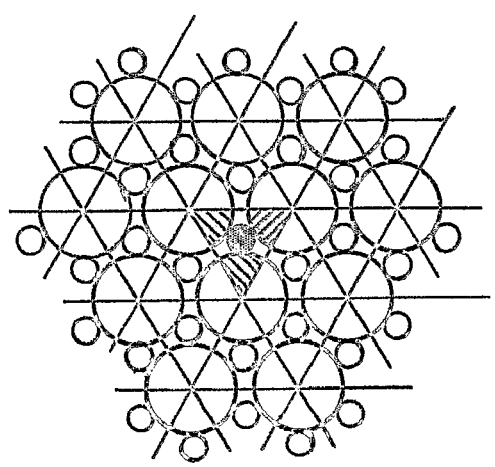
FIG. 16 shows an arrangement in which the discrete light-emissive regions are circular and the pixels are triangular.

The previously illustrated arrangements comprise square pixels. However, the present invention is not so limited. The pixels may, for example, have a hexagonal, square or triangular shape as shown in FIGS. 14 to 16.

Figure 17:
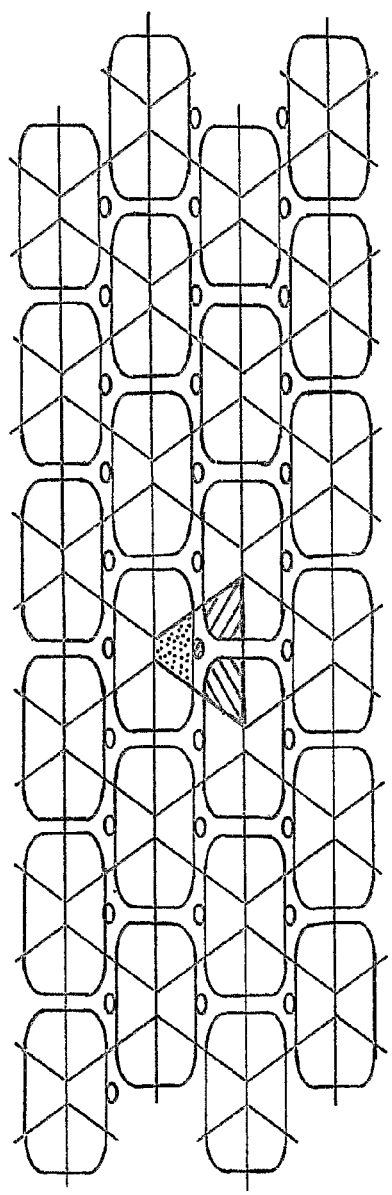
FIG. 17 shows two arrangements in which the discrete light-emissive regions are substantially rectangular and the pixels are substantially triangular.
Figure 17:
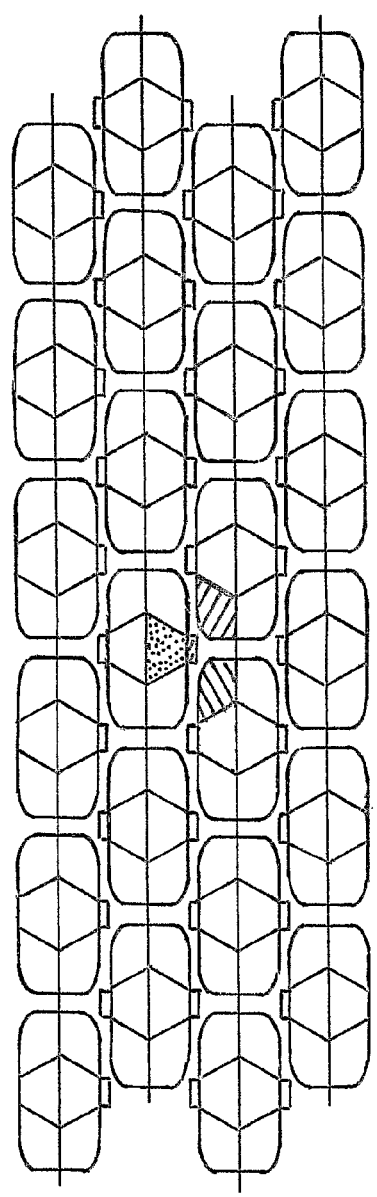

FIG. 17 shows two further arrangements in which the discrete light-emissive regions are substantially rectangular or square and the pixels are substantially triangular. These arrangements may have the most pixels per discrete light-emissive region for a "square-tile" type arrangement. The top layout is optimised for a smooth macro-pixel outline. However, in this arrangement the centroids of the macro-pixels do not lie exactly on the square tile points of the square-tile arrangement. The bottom layout does not have a smooth macro-pixel outline. However, in this arrangement the centroids of the macro-pixels lie on the square tile points. Other considerations include the area of ink lost to drying effects, and in this case the top layout is more immune to these effects as each sub-pixel has approximately the same proportion of well edge and well centre area.

It is to be noted that by providing an addressing array that can separately address a number of portions of the colour-forming regions, the resolution of the display is increased without changing the pattern of the colour-forming layer. For example, in the arrangements illustrated in FIGS. 14 to 16, the resolution has been increased by a factor of 3, 4 and 6 respectively with no change in the pattern of the colour-forming layer when compared with analogous arrangements in which the discrete colour-forming regions do not comprise individually addressable portions.

The arrangements provide enhanced resolution and may be most effective where pixel sizes are on the edge of the eye's spatial resolution. In particular, blocks of primary colours on a screen may appear dithered as, in effect, with this technique there are clusters of one sub-pixel colour rather than an even distribution. However the resolution of the eye to luminance variation is twice that of its red-green colour resolution, which is itself twice the blue-yellow colour resolution. Thus, for very fine resolutions where the macro-pixel spacing is equal to the eye's ability to resolve neighbouring pixels, this clustering will not be evident.

This technique could also be utilized to achieve the increased resolution required for 3D displays without requiring smaller ink-wells. For 3-D displays, where different macro-pixels are projected in different directions to produce multiple views, it could be arranged such that only similar sub-pixel groupings are projected in any given direction thus removing the visual effect of sub-pixels clustering.

Although preferred embodiments of the present invention have been described with reference to an organic light-emissive display, it is to be understood that other types of display such as LCDs and Plasma Displays, as well as other EL displays such as inorganic EL displays, can utilize the present invention.

The invention claimed is:

1. An optoelectronic display comprising a plurality of pixels, each pixel comprising a plurality of sub-pixels, the optoelectronic display comprising:
   a substrate;
   a first electrode layer disposed over the substrate;
   the light-emissive layer disposed over the first electrode layer, wherein the light-emissive layer is patterned to provide a plurality of discrete light-emissive regions in a two-dimensional array; and
   a second electrode layer disposed over the light-emissive layer,
   wherein the first electrode layer and/or the second electrode layer comprise a plurality of electrodes, each electrode comprising at least two sub-electrodes associated with each discrete light-emissive region,
   wherein at least some of the discrete light-emissive regions have portions which are separately addressable by the plurality of electrodes, and
   wherein each portion of the discrete light-emissive regions defines a respective sub-pixel of the plurality of sub-pixels.

2. A display according to claim 1, wherein each separately addressable portion defines a sub-pixel of a different pixel in the optoelectronic display.

3. A display according to claim 1, wherein the discrete light-emissive regions comprise 2, 3, 4 or 6 separately addressable portions.

4. A display according to claim 1, wherein the pixels are square, rectangular, triangular or hexagonal in shape.

5. A display according to claim 1, wherein the discrete light-emissive regions are one or more of square, rectangular, circular, oval, and hexagonal in shape.

6. A display according claim 1, wherein the optoelectronic display is a multicolour display.

7. A display according to claim 1, wherein a gap is provided between said sub-electrodes for preventing lateral conduction between the sub-electrodes.

8. A display according to claim 7, wherein said gap is filled with an insulating material in order to planarize an upper surface of the electrodes.

9. A display according to claim 8, wherein said insulating material is an inorganic dielectric material or an organic photoresist material.

10. A display according to claim 1, wherein said sub-electrodes comprise a patterned layer of conductive material and an unpatterned layer of conductive material, said unpatterned layer being less conductive than said patterned layer for preventing lateral conduction between the sub-electrodes.

11. A display according to claim 10, wherein the patterned layer comprises a patterned conductive contact layer defining the sub-electrodes and the unpatterned layer comprises a uniform layer of charge injecting material.

12. A display according to claim 1, wherein the light-emissive layer is patterned by providing a bank structure disposed over the first electrode layer defining a plurality of wells, each well containing one of the discrete light-emissive regions, whereby at least two sub-electrodes are associated with each well.

13. A display according to claim 1, wherein the first electrode layer comprises the sub-electrodes.

14. A display according to claim 1, wherein the sub-electrodes are anodes.

15. A display according to claim 1, wherein the light-emissive layer comprises an organic light-emissive material.

16. A display according to claim 15, wherein the light-emissive layer comprises a polymer light-emissive material.

17. A display according to claim 1, wherein a conductive polymer layer is disposed between one of the electrode layers and the light-emissive layer.

18. A method of manufacturing an optoelectronic display, the method comprising:
providing a substrate;
depositing a first electrode layer over the substrate;
depositing a light-emissive layer as a colour-forming layer over the first electrode layer; and
depositing a second electrode layer over the light-emissive layer,
wherein the light-emissive layer is patterned providing a two-dimensional array of discrete light-emissive regions, and wherein the first electrode layer and/or the second electrode layer comprises a plurality of electrodes, each electrode comprising at least two sub-electrodes associated with each discrete light-emissive region.

19. A method according to claim 18, wherein the colour-forming layer is deposited from solution.

20. A method according to claim 19, wherein the colour-forming layer is deposited by ink-jet printing or spin coating.

21. A method according to claim 18, wherein the light-emissive layer is patterned by depositing a bank structure disposed over the first electrode layer defining a plurality of wells prior to depositing the light-emissive layer, the light-emissive layer being subsequently deposited such that each well contains one of the discrete light-emissive regions, whereby at least two sub-electrodes are associated with each well.

22. A method according to claim 18, wherein the sub-electrodes are patterned by laser ablation, e-beam ablation, dry etching, wet etching, or direct writing.

* * * * *